United States Patent
Lin et al.

(10) Patent No.: US 11,545,977 B2
(45) Date of Patent: *Jan. 3, 2023

(54) LOGIC BUFFER CIRCUIT AND METHOD

(71) Applicant: TAIWAN SEMICONDUCTOR MANUFACTURING COMPANY LTD., Hsinchu (TW)

(72) Inventors: Wan-Yen Lin, Hsinchu (TW); Yuan-Ju Chan, Hsinchu (TW); Bo-Ting Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/227,815

(22) Filed: Apr. 12, 2021

(65) Prior Publication Data

US 2021/0234541 A1 Jul. 29, 2021

Related U.S. Application Data

(63) Continuation of application No. 16/789,072, filed on Feb. 12, 2020, now Pat. No. 10,979,049.

(Continued)

(51) Int. Cl.
*H03K 19/003* (2006.01)
*H03K 19/0185* (2006.01)

(52) U.S. Cl.
CPC . *H03K 19/00384* (2013.01); *H03K 19/00323* (2013.01); *H03K 19/0185* (2013.01)

(58) Field of Classification Search
CPC .......... H03K 19/003; H03K 19/00315; H03K 19/00323; H03K 19/00346;
(Continued)

(56) References Cited

U.S. PATENT DOCUMENTS 4,617,529 A * 10/1986 Suzuki ................. H03K 3/0315
331/176
5,041,741 A * 8/1991 Steele ............... H03K 19/00361
327/559
(Continued)

FOREIGN PATENT DOCUMENTS

JP  H07202653  8/1995
JP  2002368589  12/2002
(Continued)

OTHER PUBLICATIONS

Office Action dated Dec. 21, 2020 from corresponding application No. TW 10921236370 (pp. 1-6).
(Continued)

*Primary Examiner* — Jason Crawford
(74) *Attorney, Agent, or Firm* — Hauptman Ham, LLP

(57) ABSTRACT

A buffer circuit includes an input terminal configured to receive an input signal, an output terminal, a buffer, and an RC circuit coupled in series with the buffer between the input terminal and the output terminal. The RC circuit includes a first transistor and an RC network including a resistor and a capacitor, the first transistor is coupled in series with the resistor between a power supply node and a reference node, and the buffer and the RC circuit are configured to generate an output signal based on the input signal.

20 Claims, 7 Drawing Sheets

Related U.S. Application Data

(60) Provisional application No. 62/843,049, filed on May 3, 2019.

(58) Field of Classification Search
CPC ....... H03K 19/00361; H03K 19/00369; H03K 19/00384; H03K 19/007; H03K 19/0185; H03K 17/08
See application file for complete search history.

(56) References Cited

U.S. PATENT DOCUMENTS

| | | | |
|---|---|---|---|
| 5,506,534 A | 4/1996 | Guo et al. | |
| 5,656,947 A * | 8/1997 | Opris | H03F 3/72 326/82 |
| 5,959,820 A * | 9/1999 | Ker | H01L 27/0248 361/111 |
| 6,127,898 A * | 10/2000 | Naura | H03K 3/354 327/264 |
| 6,249,410 B1 * | 6/2001 | Ker | H02H 9/046 361/111 |
| 6,320,443 B1 * | 11/2001 | Jeong | H03K 5/1534 327/264 |
| 6,335,633 B1 | 1/2002 | Kirsch | |
| 7,423,855 B2 * | 9/2008 | Fankhauser | H01L 27/0266 361/56 |
| 7,746,141 B2 * | 6/2010 | Takahashi | H03H 11/265 327/264 |
| 8,169,761 B2 * | 5/2012 | Yeh | H03F 1/523 361/111 |
| 9,553,446 B2 * | 1/2017 | Gerdemann | H02H 9/046 |
| 10,110,221 B1 * | 10/2018 | Sharma | H03K 17/6871 |
| 10,979,049 B2 * | 4/2021 | Lin | H03K 19/0185 |
| 2004/0027742 A1 * | 2/2004 | Miller | H01L 27/0292 361/111 |
| 2006/0044028 A1 * | 3/2006 | Bhattacharya | H03K 17/223 327/143 |
| 2006/0203405 A1 * | 9/2006 | Bhattacharya | H01L 27/0266 361/91.1 |
| 2008/0036490 A1 * | 2/2008 | Kim | H03K 19/007 326/14 |
| 2009/0323237 A1 * | 12/2009 | Kwak | H03K 17/04123 361/56 |
| 2010/0033884 A1 * | 2/2010 | Fan | H02H 9/046 361/56 |
| 2010/0238598 A1 * | 9/2010 | Liang | H03K 19/00315 700/121 |
| 2011/0102064 A1 * | 5/2011 | Noorlag | H03K 19/00384 327/524 |
| 2011/0149450 A1 * | 6/2011 | Maloney | H02H 9/046 361/56 |
| 2012/0187911 A1 * | 7/2012 | Mitani | H02J 7/007194 327/108 |
| 2013/0074019 A1 | 3/2013 | Mehta | |
| 2013/0105951 A1 * | 5/2013 | Popovich | H01L 27/0251 257/659 |
| 2014/0055165 A1 * | 2/2014 | Gopal | H03K 5/1252 327/34 |
| 2015/0109049 A1 | 4/2015 | Huang et al. | |
| 2018/0331682 A1 * | 11/2018 | Duduman | H02M 1/38 |
| 2019/0140635 A1 * | 5/2019 | Abesingha | H03K 17/0822 |
| 2019/0164905 A1 | 5/2019 | Hsieh et al. | |
| 2020/0350915 A1 * | 11/2020 | Lin | H03K 19/00384 |
| 2021/0234541 A1 * | 7/2021 | Lin | H03K 19/0185 |

FOREIGN PATENT DOCUMENTS

| | | |
|---|---|---|
| KR | 20100001861 | 1/2010 |
| TW | 237831 | 8/2005 |
| TW | 201703222 | 1/2017 |

OTHER PUBLICATIONS

Office Action dated Dec. 17, 2020 from corresponding application No. KR 10-2020-0033756 (pp. 1-4).

Office Action dated Apr. 20, 2021 for corresponding case No. KR 10-2020-0033756. (pp. 1-5).

* cited by examiner

LOGIC BUFFER CIRCUIT AND METHOD

PRIORITY CLAIM

The present application is a continuation of U.S. application Ser. No. 16/789,072, filed Feb. 12, 2020, which claims the priority of U.S. Provisional Application No. 62/843,049, filed May 3, 2019, each of which is incorporated herein by reference in its entirety.

BACKGROUND

Integrated circuits (ICs) are often protected from electrostatic discharge (ESD) and other potentially damaging transient events by external protection circuits referred to as overvoltage protection circuits (OPCs) or transient voltage suppressor (TVS) circuits in some cases. Such protection is typically provided while the IC is powered on and can include switching on a clamp circuit to discharge transient current, thereby avoiding a large voltage stress on an input pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
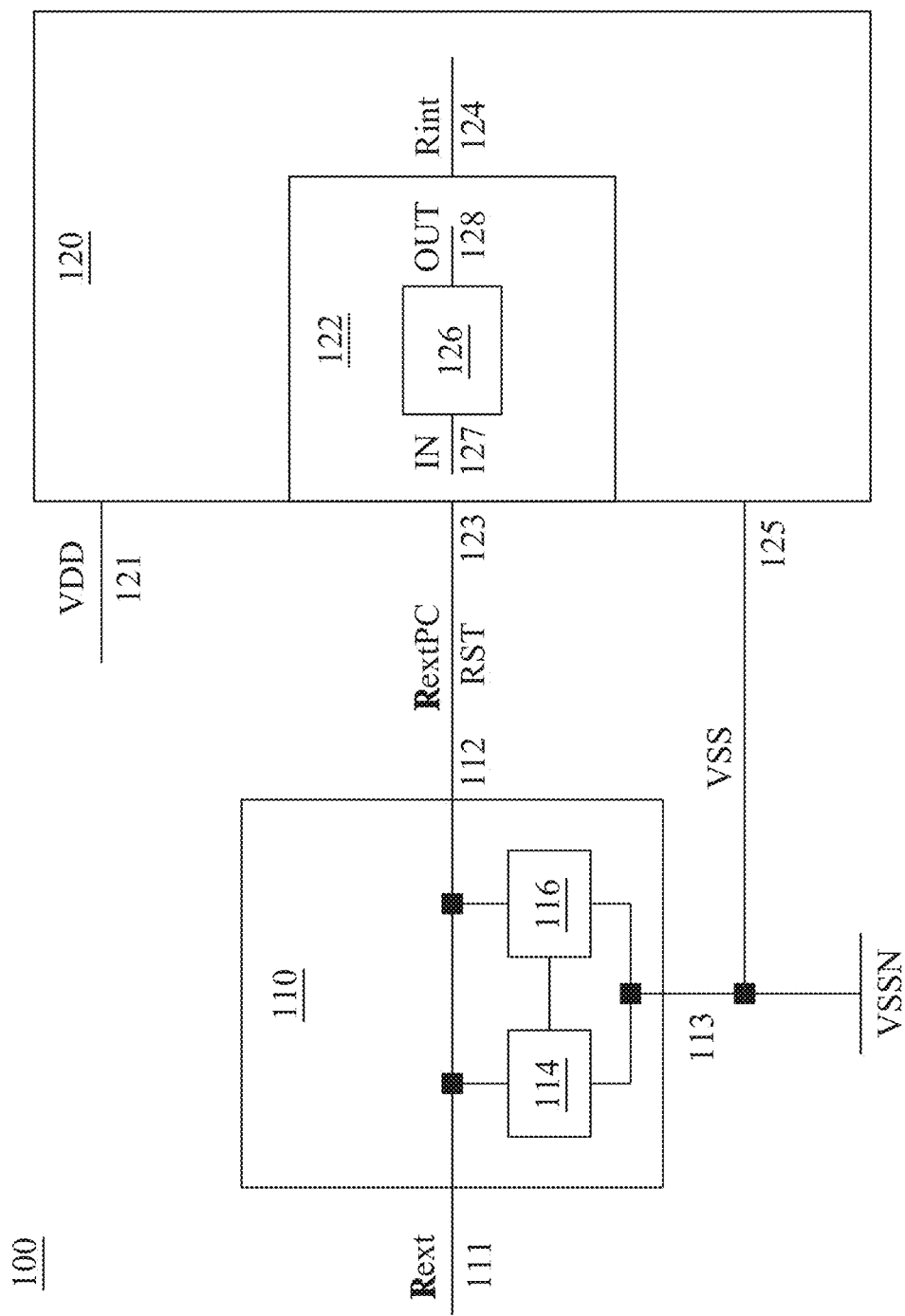
FIG. 1 is a schematic diagram of an IC system, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a buffer circuit including a delay circuit in series with one or more buffers generates an output signal having an increased time to transition between logical voltage levels compared to a transition time of an input signal. By increasing the transition time using the delay circuit, e.g., an RC circuit, the buffer circuit is capable of preventing unwanted output signal transitions triggered by short-duration input signal logic inversions, e.g., those based on ESD events. Compared to approaches that do not include delay circuits, the buffer circuit is better able to generate an output signal having a constant logical voltage level in response to a short-duration input signal logic inversion.

FIG. 1 is a schematic diagram of an IC system 100, in accordance with some embodiments. IC system 100 includes a protection circuit 110 coupled to an IC chip 120 through a signal path RST. In some embodiments, IC system 100 includes protection circuit 110 and IC chip 120 as discrete components mounted on a substrate, e.g., a printed circuit board (PCB). In some embodiments, IC system 100 is a portion or all of an IC device package, e.g., a 2.5D IC package, a 3D IC package, or an integrated fan-out (InFO) package. In some embodiments, IC system 100 includes components in addition to those depicted in FIG. 1, e.g., an interposer and/or one or more IC chips in addition to IC chip 120.

Two or more circuit elements are considered to be coupled based on a direct electrical connection or an electrical connection that includes one or more additional circuit elements, e.g., one or more logic or transmission gates, and is thereby capable of being controlled, e.g., made resistive or open by a transistor or other switching device.

In the embodiment depicted in FIG. 1, protection circuit 110 is directly connected to IC chip 120 through signal path RST. In various embodiments, one or more additional circuit elements, e.g., one or more switching devices, are coupled between protection circuit 110 and IC chip 120 along signal path RST. In various embodiments, signal path RST includes a bonding wire, one or more redistribution layers (RDLs) of a post-passivation interconnect (PPI) structure that includes multiple RDLs, and/or one or more other conductive elements suitable for transmitting one or more signals between protection circuit 110 and IC chip 120.

Protection circuit 110 is an electronic circuit including an input terminal 111 coupled to an output terminal 112, a voltage reference terminal 113, a detection circuit 114 coupled between input terminal 111 and voltage reference terminal 113, and a clamp circuit 116 coupled between output terminal 112 and voltage reference terminal 113.

In various embodiments, input terminal 111 is coupled to a circuit (not shown) internal or external to IC system 100 and is thereby configured to receive a signal Rext. Output terminal 112 is coupled to signal path RST, and is thereby configured to output a signal RextPC to signal path RST.

Voltage reference terminal 113 is coupled to a reference voltage node VSSN, and is thereby configured to receive a reference voltage VSS from reference voltage node VS SN. In some embodiments, reference voltage VSS has a reference voltage level, e.g., a ground voltage level, of IC system 100.

A signal, e.g., one or both of signals Rext or RextPC, is capable of having multiple voltage levels corresponding to logical states. Voltage levels below a first threshold value relative to the reference voltage level correspond to a low logical state, referred to as a low logical voltage level in some embodiments, and voltage levels above a second threshold value, greater than the first threshold value, relative to the reference voltage level correspond to a high logical state, referred to as a high logical voltage level in some embodiments.

Detection circuit 114 is an electronic circuit configured to detect a voltage level of signal Rext relative to the reference voltage level, and, responsive to an overvoltage condition of signal Rext, e.g., an ESD event, output a control signal (not labeled) usable by clamp circuit 116 and indicative of the overvoltage condition. In some embodiments, detection circuit 114 is configured to output the control signal having a first one of the low or high logical voltage levels corresponding to a normal operating condition and a second one of the low or high logical voltage levels corresponding to an overvoltage condition.

Clamp circuit 116 is an electronic circuit configured to receive the control signal output by detection circuit 114, and includes one or more switching devices (not shown) configured to selectively establish a current path between output terminal 112 and reference terminal 113 responsive to the control signal. In some embodiments, clamp circuit 116 includes the one or more switching devices configured to selectively establish the current path by directly coupling output terminal 112 to reference terminal 113. In various embodiments the one or more switching devices include an n-type metal oxide semiconductor (NMOS) transistor or a p-type metal oxide semiconductor (PMOS) transistor, and the current path includes a channel of the NMOS or PMOS transistor.

In some embodiments, clamp circuit 116 is configured to interrupt the current path in response to the control signal having the first logical voltage level corresponding to the normal operating condition and establish the current path in response to the control signal having the second logical voltage level corresponding to the overvoltage condition.

In various embodiments, detection circuit 114 and clamp circuit 116 are configured to detect and respond to a transient overvoltage condition of signal Rext based on one or more of an ESD event, e.g., based on a human body model (HBM) or charge device model (CDM), an electrical overstress (EOS) event, or other transient overvoltage condition. In various embodiments, one or both of detection circuit 114 or clamp circuit 116 includes one or more sub-circuits (not shown) and is thereby configured to be responsive to more than one type of overvoltage condition.

Protection circuit 110 is thereby configured to detect a voltage level of signal Rext and, in response to a normal operating condition of signal Rext, output signal Rext on output terminal 112 as signal RextPC, and in response to a detected overvoltage condition of signal Rext, output signal RextPC having a voltage level at or near that of reference voltage VSS, thereby corresponding to the low logical voltage level.

The configuration of protection circuit 110 depicted in FIG. 1 is a non-limiting example provided for the purpose of illustration. In various embodiments, protection circuit 110 is otherwise configured, e.g., by including one or more circuit components between input terminal 111 and output terminal 112, to detect and respond to a normal operating condition of signal Rext by outputting signal Rext on output terminal 112 as a signal RextPC, and to detect and respond to an overvoltage condition of signal Rext by outputting signal RextPC having the low logical voltage level. In some embodiments, protection circuit 110 does not include detection circuit 114 and is configured to receive a control signal from an external circuit (not shown) and/or is configured to detect an overvoltage condition based on a signal other than signal Rext, and is thereby configured to output signal RextPC having the low logical voltage level in response to a detected overvoltage condition.

Protection circuit 110 is configured to output signal RextPC having the low logical voltage level for a duration based on one or both of a timing characteristic of the detected overvoltage condition or the configurations of detection circuit 114 and clamp circuit 116. In operation, for the case in which protection circuit 110 outputs signal RextPC having the high logical voltage level before and after a detected overvoltage condition, signal RextPC having the low logical voltage level represents a logic inversion having a duration corresponding to the duration of protection circuit 110 outputting signal RextPC having the low logical voltage level. In some embodiments, the case in which protection circuit 110 outputs signal RextPC having the high logical voltage level before and after one or more logic inversions corresponds to a normal operating mode of IC system 100.

In various embodiments, protection circuit 110 is configured to output signal RextPC having the voltage level at or near the reference voltage level for the duration being a predetermined duration, a variable duration, or either one or the other of a predetermined or variable duration depending on the nature of the detected overvoltage condition, e.g., a predetermined duration based on a detected ESD event and a variable duration based on a detected EOS event.

In some embodiments, protection circuit 110 is configured to output signal RextPC having the voltage level at or near the reference voltage level for one or both of the predetermined or variable duration ranging from 0.1 microseconds (µs) to 100 µs. In some embodiments, protection circuit 110 is configured to output signal RextPC having the voltage level at or near the reference voltage level for one or both of the predetermined or variable duration ranging from 0.2 µs to 10 µs. In some embodiments, protection circuit 110 is configured to output signal RextPC having the voltage level at or near the reference voltage level for one or both of the predetermined or variable duration ranging from 0.5 µs to 2 µs.

IC chip 120 is a semiconductor chip including an input terminal 121 coupled to a power supply voltage node VDDN configured to carry a power supply voltage VDD having a power supply voltage level, a buffer circuit 122 including an input terminal 123 coupled to signal path RST and an output terminal 124, an input terminal 125 coupled to reference voltage node VSSN, and one or more additional components that are not depicted in FIG. 1 for the purpose of clarity. In some embodiments, one or more of input terminal 121, input terminal 123, or input terminal 125 includes a contact pad of IC chip 120.

In some embodiments, IC chip 120 includes a system on a chip (SoC). A SoC includes multiple ICs, e.g., a combination of processors, co-processors, signal processing circuits, logic circuits, controllers, memory circuits, application specific ICs (ASICs), input/output (I/O) interfaces, communication circuits, or the like, integrated within a single semiconductor chip.

At least one component of IC chip 120 includes a power-on circuit (POC) (not shown) configured to initiate a power-on sequence responsive to signal Rint received from output terminal 124. In operation, the power-on sequence includes one or more steps by which at least a portion of IC chip 120, including, e.g., one or more registers, flip-flops, and or latches, is controllably configured to function in a normal operating mode, and IC chip 120 is prevented from functioning in the normal operating mode during execution of the power-on sequence. In various embodiments, the POC is configured to initiate the power-on sequence in response to signal Rint having either the high or the low logical voltage level. In various embodiments, one or more of signals Rext, RextPC, or Rint is referred to as a reset signal, signal RextPC is referred to as a protected signal or protected reset signal, and/or input terminal 123 is referred to as a reset pin.

Buffer circuit 122 is an electronic circuit configured to receive signal RextPC at input terminal 123, generate signal Rint based on signal RextPC, and output signal Rint at output terminal 124. Buffer circuit 122 includes at least one buffer (not shown in FIG. 1) and at least one delay circuit 126 coupled in series between input terminal 123 and output terminal 124. At least one buffer included in buffer circuit 122 is coupled between delay circuit 126 and output terminal 124. In some embodiments, buffer circuit 122 includes one or more components (not shown) in addition to those discussed above, that are not depicted or further discussed for the purpose of illustration.

Delay circuit 126 includes an input terminal 127 and an output terminal 128. In various embodiments, input terminal 127 is coupled to input terminal 123 of buffer circuit 122, or is coupled to an output terminal of a buffer of the at least one buffer of buffer circuit 122. Output terminal 128 is coupled to an input terminal of a buffer of the at least one buffer of buffer circuit 122.

Delay circuit 126 is configured to generate a signal OUT by inverting a signal IN received at input terminal 127, and by increasing a transition time between logical voltage levels of signal OUT relative to a transition time between logical voltage levels of signal IN, as discussed below. In various embodiments, delay circuit 126 is configured to increase transition times of one or both of signal OUT transitions from the low logical voltage level to the high logical voltage level or signal OUT transitions from the high logical voltage level to the low logical voltage level.

By including delay circuit 126, buffer circuit 122 is configured to increase a transition time between logical voltage levels of signal Rint relative to a transition time between logical voltage levels of signal RextPC. In various embodiments, buffer circuit 122 includes one of buffer circuits 222A or 222B discussed below with respect to FIGS. 2A and 2B or a buffer circuit 400 discussed below with respect to FIG. 4.

The signal RextPC transition time corresponds to a time to transition from the high logical voltage level to the low logical voltage level, e.g., at the onset of the duration during which protection circuit 110 outputs signal RextPC having the voltage level at or near that of reference voltage VSS in response to a detected overvoltage condition of signal Rext. The signal Rint transition time corresponds to a time to transition from the high logical voltage level to the low logical voltage level in some embodiments, or to a time to transition from the low logical voltage level to the high logical voltage level in some embodiments. Non-limiting examples of signal transition times are discussed below with respect to FIG. 5.

In some embodiments, delay circuit 126 includes a resistor-capacitor (RC) network (not shown in FIG. 1), e.g., an RC network of a delay circuit 300A-300D discussed below with respect to FIGS. 3A-3D, and is thereby configured to increase the signal Rint transition time relative to the signal RextPC transition time based on signal OUT. In some embodiments, delay circuit 126 includes an inverter delay, a counter, or other suitable circuit component, and is thereby otherwise configured to increase the signal Rint transition time relative to the signal RextPC transition time based on signal OUT.

In various embodiments, the at least one buffer and delay circuit 126 included in buffer circuit 122 are configured to output signal Rint as a synchronized signal having a same low or high logical voltage level as input signal RextPC in a steady state, or as a complementary signal having the low or high logical voltage level opposite that of input signal RextPC in a steady state.

The at least one buffer included in buffer circuit 122 is an electronic circuit configured to receive an input signal at an input terminal (not shown in FIG. 1), and generate an output signal at an output terminal (not shown in FIG. 1) responsive to a voltage level of the input signal relative to a threshold voltage, e.g., a threshold voltage of a transistor, of the buffer circuit. In various embodiments, the at least one buffer included in buffer circuit 122 includes one or both of an inverter or a non-inverting circuit component, e.g., an amplifier.

In some embodiments, the at least one buffer and delay circuit 126 included in buffer circuit 122 is configured to increase the transition time of signal Rint relative to the transition time of signal RextPC based on a threshold voltage of a buffer coupled to output terminal 128. In some embodiments, the threshold voltage corresponds to an NMOS transistor and the transition time of signal Rint corresponds to a time required for signal OUT to ramp up from the reference voltage level of reference voltage VSS to the threshold voltage. In some embodiments, the threshold voltage corresponds to a PMOS transistor and the transition time of signal Rint corresponds to a time required for signal OUT to ramp down from the power supply voltage level of power supply voltage VDD to the threshold voltage.

Delay circuit 126 is configured to ramp signal OUT toward the threshold voltage responsive to signal IN having a first one of the low or high logical voltage levels, and to ramp signal OUT toward the corresponding one of the reference or power supply voltage levels responsive to signal IN having the second one of the low or high logical voltage levels.

In operation, because the output signal of the buffer coupled to delay circuit 126 does not undergo a transition from a first logical voltage level to a second logical voltage level until signal OUT reaches the threshold voltage, the buffer output signal does not transition if signal IN has the first logical voltage level for a length of time less than the time required to ramp signal OUT to the threshold voltage. Delay circuit 126, in combination with the threshold voltage, thereby defines a time threshold such that signal IN having the first logical voltage level for a length of time less than the time threshold is prevented from causing a transition in the buffer output signal.

In some embodiments, delay circuit 126 is configured to, for a given threshold voltage, define the time threshold based on one or more expected values of the duration of a logic inversion in signal RextPC output by protection circuit 110, as discussed above. In some embodiments, the one or more expected values include a predetermined duration corresponding to an ESD model, e.g., a HBM or CDM.

In some embodiments, IC system 100 does not include protection circuit 110, and delay circuit 126 is configured to define the time threshold based on one or more expected values of a duration of a logic inversion in a signal, e.g., signal RextPC having the characteristics discussed above, received by buffer circuit 122 from a source other than protection circuit 110. In some embodiments, a logic inversion in a signal received by buffer circuit 122 corresponds to a transition from the low logical voltage level to the high logical voltage level followed by a transition from the high logical voltage level to the low logical voltage level.

By the configuration discussed above, buffer circuit 122 is capable of increasing the transition time of signal Rint relative to the transition time of signal RextPC such that, in response to signal RextPC having the logic inversion for a duration shorter than the time threshold, buffer circuit 122 outputs signal Rint while maintaining a given logical voltage level. In some embodiments, buffer circuit 122 is otherwise configured so as to increase the transition time of signal Rint relative to the transition time of signal RextPC.

By being configured to increase the transition time of signal Rint relative to the transition time of signal RextPC, buffer circuit 122 is configured to increase a response time of a circuit that receives signal Rint relative to signal RextPC, e.g., a response time of a POC relative to one or both of signals RextPC or Rext. In some embodiments, buffer circuit 122 is configured to increase the transition time of signal Rint relative to the transition time of signal RextPC by an amount less than a predetermined response time, e.g., a response time included as a specification of a circuit, e.g., a SoC.

In some embodiments, buffer circuit 122 is configured to increase the transition time of signal Rint to a time ranging from 0.2 µs to 1000 µs. In some embodiments, buffer circuit 122 is configured to increase the transition time of signal Rint to a time ranging from 1 µs to 100 µs. In some embodiments, buffer circuit 122 is configured to increase the transition time of signal Rint to a time ranging from 2 µs to 10 µs.

By including delay circuit 126 and thereby being configured to increase the transition time of signal Rint relative to the transition time of signal RextPC, buffer circuit 122 is capable of preventing output signal transitions triggered by short-duration logic inversions in an input signal, e.g., those based on ESD events. Compared to approaches that do not include delay circuits, buffer circuit 122 is better able to generate an output signal having a constant logical voltage level in response to a short-duration logic inversion in an input signal.

In embodiments in which buffer circuit 122 is included in an IC system, e.g., IC system 100, a POC that receives signal Rint having the constant voltage level is thereby prevented from initiating an unwanted power-on sequence in response to a logic inversion having a sufficiently short duration.

Figure 2A:
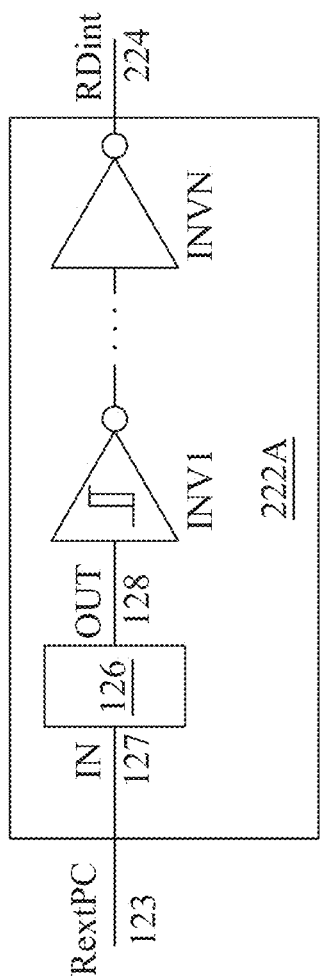
FIG. 2A is a schematic diagram of a buffer circuit, in accordance with some embodiments.

FIG. 2A is a schematic diagram of buffer circuit 222A, in accordance with some embodiments. Buffer circuit 222A is usable as buffer circuit 122 discussed above with respect to FIG. 1.

Buffer circuit 222A includes input terminal 123 and delay circuit 126 including input terminal 127 coupled to input terminal 123, each discussed above with respect to FIG. 1, an output terminal 224, and a number N of inverters INV1-INVN coupled in series between output terminal 128 of delay circuit 126 and output terminal 224. Output terminal 224 is usable as output terminal 124, and inverters INV1-INVN are usable as the at least one buffer of buffer circuit 122, discussed above with respect to FIG. 1. In various embodiments, delay circuit 126 of buffer circuit 222A includes one of delay circuits 300A-300D, discussed below with respect to FIGS. 3A-3D. In some embodiments, buffer circuit 222A includes one or more components (not shown) in addition to those discussed above, that are not depicted or further discussed for the purpose of illustration.

Each of inverters INV1-INVN is a logic gate configured to receive an input signal at an input terminal, and generate a complementary output signal at an output terminal. In some embodiments, each of inverters INV1-INVN includes a PMOS transistor (not shown) coupled in series with an NMOS transistor (not shown) between power supply voltage VDD and reference voltage VSS, gates of the PMOS and NMOS transistors are coupled together and configured to receive the input signal, and drain terminals of the PMOS and NMOS transistors are coupled together and configured to generate the output signal.

In the embodiment depicted in FIG. 2A, inverter INV1 includes one or more circuits, e.g., a Schmitt trigger, configured to perform a hysteresis function by setting the threshold voltage for the transition from the low logical voltage level to the high logical voltage level greater than the threshold voltage for the transition from the high logical voltage level to the low logical voltage level. In operation, the hysteresis circuit functions to provide protection against transitions triggered by noise signals having magnitudes that are small relative to the threshold voltages, thereby acting as a noise filter. In some embodiments, inverter INV1 does not include one or more circuits configured to perform a hysteresis function.

In various embodiments, buffer circuit 222A includes delay circuit 126 and an odd number N of inverters INV1-INVN such that signal RDint is synchronized with signal RextPC, or includes delay circuit 126 and an even number N of inverters INV1-INVN such that signal RDint is complementary to signal RextPC.

In the embodiment depicted in FIG. 2A, buffer circuit 222A includes more than one of inverters INV1-INVN. In some embodiments, buffer circuit 222A includes the number N of inverters INV1-INVN equal to one. In some embodiments, buffer circuit 222A includes the number N of inverters INV1-INVN ranging from two to eight. In some embodiments, buffer circuit 222A includes the number N of inverters INV1-INVN ranging from three to five. In some embodiments, buffer circuit 222A includes the number N of inverters INV1-INVN greater than eight.

Buffer circuit 222A is thereby configured to receive signal RextPC at input terminal 123, and generate a signal RDint at output terminal 224 having an increased transition time between logical voltage levels relative to a transition time between logical voltage levels of signal RextPC. Generating signal RDint corresponds to generating signal Rint using buffer circuit 122 as discussed above with respect to FIG. 1, and in embodiments in which output terminal 224 corresponds to output terminal 124, signal RDint is usable as signal Rint.

Figure 2B:
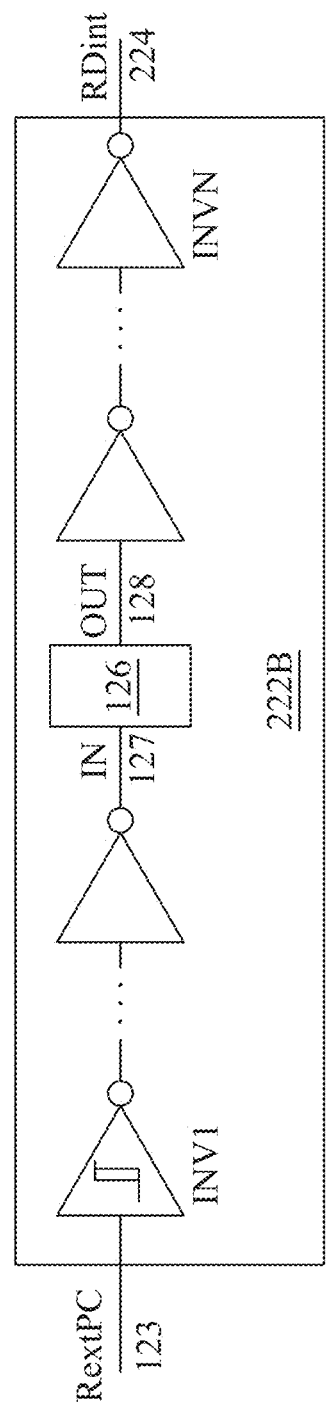
FIG. 2B is a schematic diagram of a buffer circuit, in accordance with some embodiments.
Figure 3B:
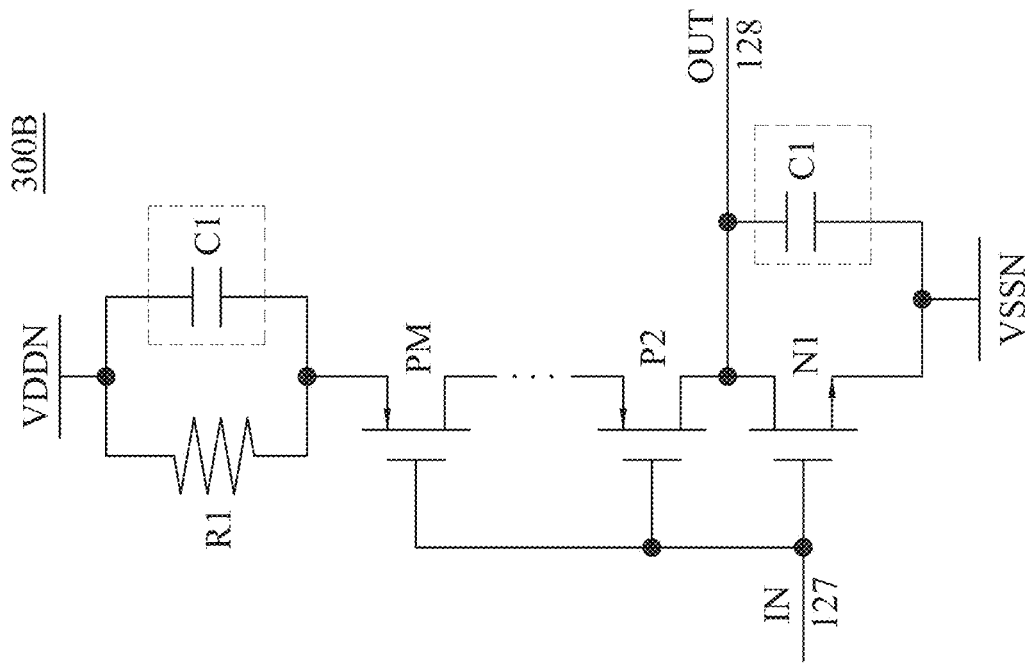
FIGS. 3A-3D are schematic diagrams of delay circuits, in accordance with some embodiments.
Figure 3A:
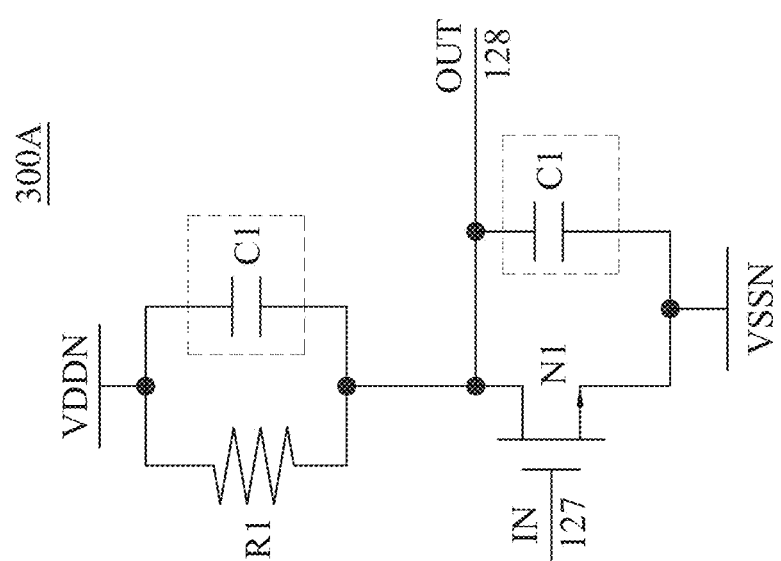
Figure 3D:
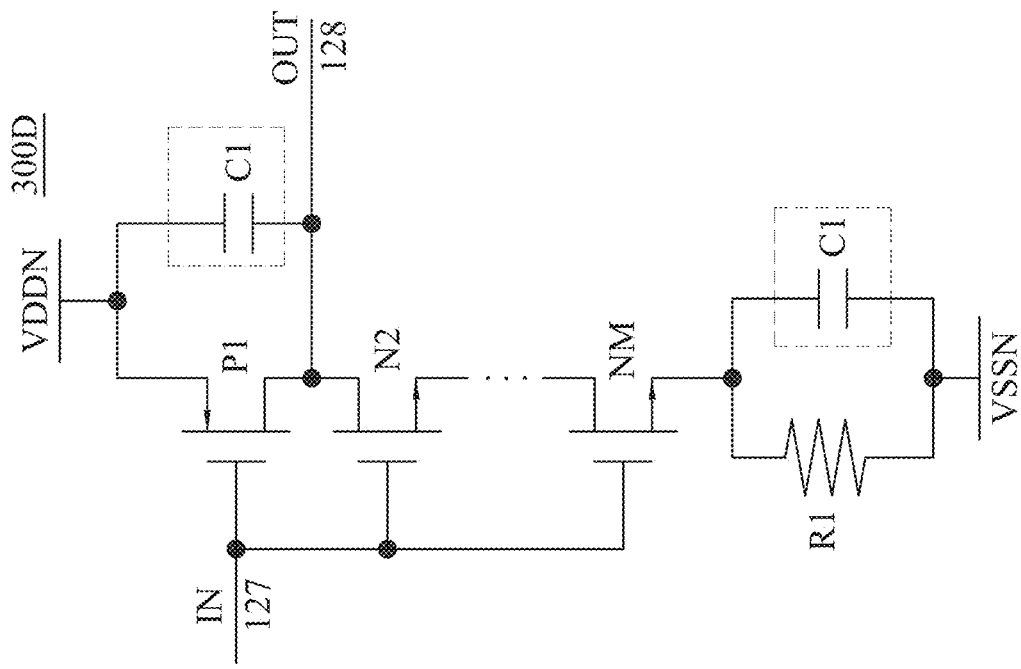
Figure 3C:
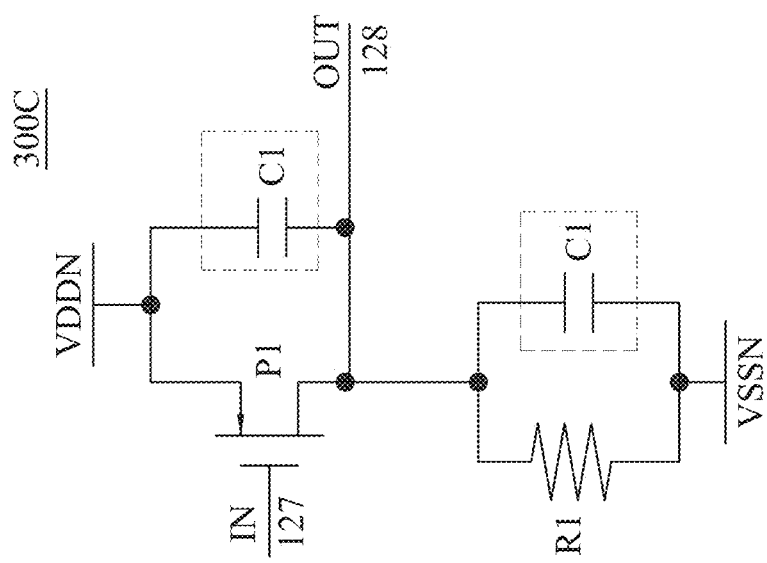

FIG. 2B is a schematic diagram of buffer circuit 222B, in accordance with some embodiments. Buffer circuit 222B is usable as buffer circuit 122 discussed above with respect to FIG. 1.

Buffer circuit 222B includes input terminal 123, output terminal 224, delay circuit 126, and inverters INV1-INVN, each discussed above with respect to buffer circuit 222A and FIG. 2A. In some embodiments, buffer circuit 222B includes one or more components (not shown) in addition to those discussed above, that are not depicted or further discussed for the purpose of illustration.

Buffer circuit 222B has a configuration that matches the configuration of buffer circuit 222A discussed above, except that delay circuit 126 is coupled between two inverters of inverters INV1-INVN instead of between input terminal 123 and inverter INV1. In the embodiment depicted in FIG. 2B, at least two inverters of inverters INV1-INVN are coupled between input terminal 123 and delay circuit 126. In some embodiments, inverter INV1 is a single inverter of inverters INV1-INVN coupled between input terminal 123 and delay circuit 126.

Buffer circuit 222B is thereby configured to receive signal RextPC at input terminal 123 and generate signal RDint at output terminal 224 in the manner discussed above with respect to buffer circuit 222A and FIG. 2A.

By including delay circuit 126 and inverters INV1-INVN configured as discussed above, each of buffer circuits 222A and 222B is configured to increase the transition time of signal RDint relative to the transition time of signal RextPC and thereby is capable of achieving the benefits, e.g., preventing output signal transitions triggered by short-duration input signal logic inversions, discussed above with respect to buffer circuit 122 and IC system 100.

FIGS. 3A-3D are schematic diagrams of respective delay circuits 300A-300D, in accordance with some embodiments. Each of delay circuits 300A-300D is usable as delay circuit 126, discussed above with respect to FIGS. 1-2B. In some embodiments, a delay circuit 300A-300D is referred to as an RC circuit.

Each of delay circuits 300A-300D includes input terminal 127 configured to receive signal IN, output terminal 128 configured to output signal OUT, power supply voltage node VDDN, and reference voltage node VSSN, each discussed above with respect to FIGS. 1-2B. Each of delay circuits 300A-300D also includes a resistive device R1 coupled between output terminal 128 and power supply voltage node VDDN in delay circuits 300A and 300B, or between output terminal 128 and reference voltage node VSSN in delay circuits 300C and 300D.

In some embodiments, resistive device R1 is arranged in parallel with a capacitive device C1, the parallel arrangement being coupled between output terminal 128 and power supply voltage node VDDN in delay circuits 300A and 300B, or between output terminal 128 and reference voltage node VSSN in delay circuits 300C and 300D. In some embodiments, the parallel arrangement of resistive device R1 and capacitive device C1 coupled between output terminal 128 and power supply voltage node VDDN or reference voltage node VSSN is referred to as an RC network.

In some embodiments, resistive device R1 is arranged in series with capacitive device C1, and capacitive device C1 is coupled between output terminal 128 and reference voltage node VSSN in delay circuits 300A and 300B, or between output terminal 128 and power supply voltage node VDDN in delay circuits 300C and 300D. In some embodiments, the series arrangement of resistive device R1 and capacitive device C1 coupled between power supply voltage node VDDN and reference voltage node VSSN is referred to as an RC network.

Delay circuits 300A and 300B include an NMOS transistor N1 coupled between output terminal 128 and reference voltage node VSSN and having a gate coupled to input terminal 127. Compared to delay circuit 300A, delay circuit 300B further includes at least one PMOS transistor P2-PM coupled in series between output terminal 128 and resistive device R1, each transistor P2-PM having a gate coupled to input terminal 127.

Delay circuits 300C and 300D include a PMOS transistor P1 coupled between output terminal 128 and power supply voltage node VDDN and having a gate coupled to input terminal 127. Compared to delay circuit 300C, delay circuit 300D further includes at least one NMOS transistor N2-NM coupled in series between output terminal 128 and resistive device R1, each transistor N2-NM having a gate coupled to input terminal 127.

In various embodiments, resistive device R1 includes an IC device, e.g., a portion of a layer including polysilicon and/or a metal or other suitable material having dimensions in accordance with a predetermined resistance value, thereby being configured to operate as a resistor in a delay circuit 300A-300D.

In various embodiments, capacitive device C1 includes one or more IC devices configured in accordance with a corresponding first or second predetermined capacitance value and is thereby configured to operate as a capacitor in a delay circuit 300A-300D. In various embodiments, capacitive device C1 includes a metal-insulator-metal (MIM) capacitor, a transistor configured as a capacitor, or another IC device suitable for providing a controlled capacitance value.

In operation, the parallel or series arrangement of resistive device R1 and capacitive device C1 configured as described above acts to control a rate at which a voltage level on output terminal 128 ramps toward the corresponding one of power supply voltage node VDDN or reference voltage node VSSN after being decoupled from the other of power supply voltage node VDDN or reference voltage node VSSN by the corresponding transistor N1 or P1.

Resistive device R1 has the predetermined resistance value and capacitive device C1 has the predetermined capacitance value corresponding to a predetermined rate at which a delay circuit 300A-300D is configured to ramp signal OUT. In operation, resistive device R1 coupled between output terminal 128 and power supply voltage node VDDN and capacitive device C1 coupled between output terminal 128 and one of power supply voltage node VDDN or reference voltage node VSSN in delay circuits 300A and 300B cause signal OUT to ramp up from the logically low voltage level to the logically high voltage level at the predetermined rate. In delay circuits 300C and 300D, resistive device R1 coupled between output terminal 128 and reference voltage node VSSN and capacitive device C1 coupled between output terminal 128 and one of power supply voltage node VDDN or reference voltage node VSSN cause signal OUT to ramp down from the logically high voltage level to the logically low voltage level at the predetermined rate.

By the configuration discussed above, in operation, the at least one transistor P2-PM in delay circuit 300B electrically isolates resistive device R1 from output terminal 128 when signal IN has the high logical voltage level, thereby reducing a leakage current between power supply voltage node VDDN and output terminal 128 compared to delay circuit 300A. In various embodiments, delay circuit 300B includes a number M of the at least one transistor P2-PM ranging from one to eight.

Similarly, by the configuration discussed above, in operation, the at least one transistor N2-NM in delay circuit 300D electrically isolates resistive device R1 from output terminal 128 when signal IN has the low logical voltage level, thereby reducing a leakage current between output terminal 128 and reference voltage node VSSN compared to delay circuit 300C. In various embodiments, delay circuit 300D includes a number M of the at least one transistor N2-NM ranging from one to eight.

The configurations of delay circuits 300A-300D depicted in FIGS. 3A-3D and discussed above are non-limiting examples whereby, in operation, signal OUT is ramped toward one of power supply voltage node VDDN or reference voltage node VSSN at a predetermined rate. In various embodiments, an RC circuit, e.g., one of delay circuits 300A-300D, includes at least one resistive device and at least one capacitive device otherwise configured to control a rate at which a signal, e.g., signal OUT, is ramped toward one of power supply voltage node VDDN or reference voltage node VS SN, in operation.

By the configurations discussed above, each of delay circuits 300A-300D is capable of increasing a transition time of signal OUT relative to a corresponding transition time of signal IN. By being included in a buffer circuit, e.g., buffer circuit 122, each of delay circuits 300A-300D is thereby capable of realizing the benefits discussed above with respect to buffer circuit 122 and IC system 100.

Figure 4:
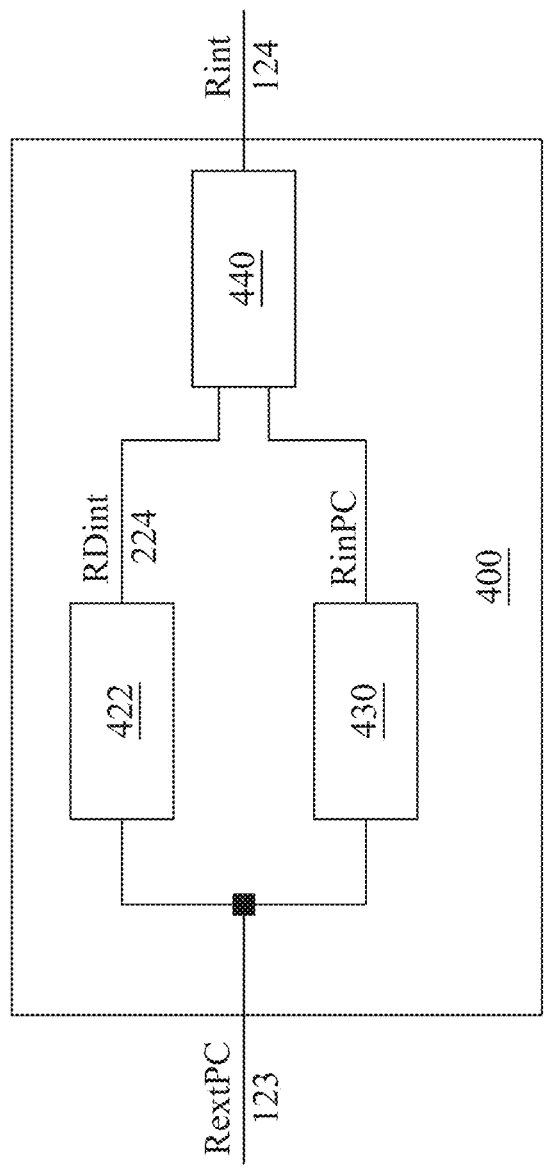
FIG. 4 is a schematic diagram of a buffer circuit, in accordance with some embodiments.

FIG. 4 is a schematic diagram of a buffer circuit 400, in accordance with some embodiments. Buffer circuit 400 is usable as buffer circuit 122 discussed above with respect to FIG. 1.

Buffer circuit 400 includes input terminal 123 and output terminal 124, each discussed above with respect to FIGS. 1-2B. Buffer circuit 400 also includes a buffer circuit 422 coupled to input terminal 123, a logic circuit 430 coupled to input terminal 123, and a logic circuit 440 coupled to output terminal 124. Buffer circuit 422 includes output terminal 224 and one of buffer circuits 222A or 222B, each discussed above with respect to FIGS. 2A and 2B. Output terminal 224 is coupled to a first input terminal (not labeled) of logic circuit 440, and logic circuit 430 includes an output terminal (not labeled) coupled to a second input terminal (not labeled) of logic circuit 440.

Logic circuit 430 includes at least one logic device (not shown) and is thereby configured to output a signal RinPC to the second input terminal of logic circuit 440 based on input signal RextPC, discussed above with respect to FIGS. 1-2B. In some embodiments, the at least one logic device includes at least one buffer coupled in series between input terminal 123 and the output terminal of logic circuit 430. In some embodiments, the at least one logic device includes a plurality of inverters coupled in series between input terminal 123 and the output terminal of logic circuit 430, the plurality of inverters having a number greater than the number N of inverters INV1-INVN discussed above with respect to FIGS. 2A and 2B.

Logic circuit 440 includes at least one logic device (not shown) and is thereby configured to receive, in addition to signal RinPC from logic circuit 430, signal RDint from buffer circuit 422, and to output signal Rint, each discussed above with respect to FIGS. 1-2B, to output terminal 124 based on signals RDint and RinPC. In some embodiments, the at least one logic device includes a NAND gate including the first and second input terminals of logic circuit 440 and at least one buffer coupled in series between the NAND gate and output terminal 124.

In some embodiments, one or both of logic circuits 430 or 440 includes one or more input terminals and/or output terminals in addition to those depicted in FIG. 4, and buffer circuit 400 is thereby configured to generate signal Rint based on one or more signals in addition to signal RextPC and/or to generate one or more signals (not shown) in addition to signal Rint.

By including logic circuits 430 and 440 in addition to buffer circuit 422, buffer circuit 400 is configured to generate signal Rint having increased flexibility compared to buffer circuits 122, 222A, and 222B discussed above. By including buffer circuit 422 including one of buffer circuits 222A or 222B, buffer circuit 400 is capable of increasing the transition time of signal Rint relative to the transition time of signal RextPC and thereby is capable of achieving the benefits, e.g., preventing output signal transitions triggered by short-duration input signal logic inversions, discussed above with respect to buffer circuit 122 and IC system 100.

Figure 5:
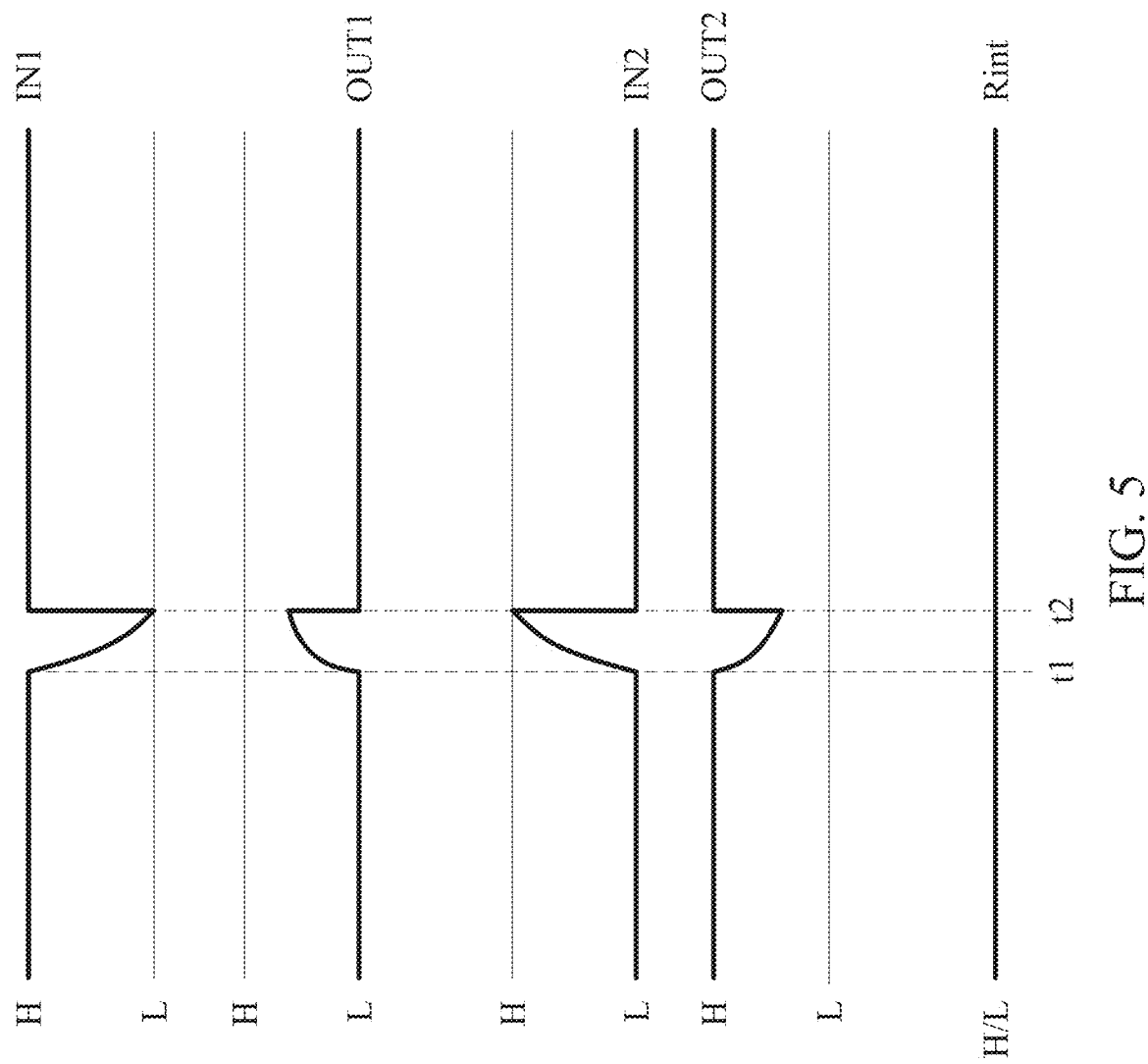
FIG. 5 is a representation of buffer circuit operating parameters, in accordance with some embodiments.

FIG. 5 is a representation of buffer circuit operating parameters, in accordance with some embodiments. FIG. 5 depicts non-limiting examples of various signals as a function of time: a signal IN1 or IN2 received by a delay circuit, a corresponding signal OUT1 or OUT2 generated by the delay circuit, and signal Reset generated by a buffer circuit including the delay circuit, e.g., buffer circuit 122 including delay circuit 126.

Signals IN1 and OUT1 are non-limiting examples of respective signals IN and OUT, discussed above with respect to FIGS. 1-3D, for an embodiment in which delay circuit 126 increases the time in which signal OUT transitions from the low logical voltage level to the high logical voltage level relative to the time in which signal IN transitions from the high logical voltage level to the low logical voltage level. Signals IN2 and OUT2 are non-limiting examples of respective signals IN and OUT for an embodiment in which delay circuit 126 increases the time in which signal OUT transitions from the high logical voltage level to the low logical voltage level relative to the time in which signal IN transitions from the low logical voltage level to the high logical voltage level. Signal Reset is a non-limiting example of signal Rint, discussed above with respect to FIGS. 1-4, corresponding to either of the non-limiting examples discussed above.

Each of signals IN1, IN2, OUT1, OUT2, and Reset is depicted relative to a high logic level H and a low logic level L. In various embodiments, the high logic level H corresponds to the high logical voltage level or to a threshold voltage, e.g., a threshold voltage of a buffer, and the low logic level L corresponds to the low logical voltage level or to a threshold voltage, e.g., a threshold voltage of a buffer.

Prior to a time t1, signal IN1 has the high logic level H and signal OUT1 has the low logic level L. From time t1 to a time t2, signal IN1 transitions to and remains at the low logic level L, at which time signal IN1 returns to the high logic level H. Signal IN1 having the low logic level L represents a logic inversion having a duration from time t1 to time t2. At time t1, signal OUT1 ramps up from the low logic level L toward the high logic level H at a rate determined by the configuration of delay circuit 126. Based on the relatively increased transition time, signal OUT1 remains below the high logic level H at time t2, at which time signal OUT1 returns to the low logic level L in response to signal IN1 returning to the high logic level H.

Prior to time t1, signal IN2 has the low logic level L and signal OUT2 has the high logic level H. From time t1 to time t2, signal IN2 transitions to and remains at the high logic level H, at which time signal IN2 returns to the low logic level L. Signal IN2 having the high logic level H represents a logic inversion having a duration from time t1 to time t2. At time t1, signal OUT2 ramps down from the high logic level H toward the low logic level L at a rate determined by the configuration of delay circuit 126. Based on the relatively increased transition time, signal OUT2 remains above the low logic level L at time t2, at which time signal OUT2 returns to the high logic level H in response to signal IN2 returning to the low logic level L.

In the first embodiment, because signal OUT1 remains below the high logic level H throughout the duration of the logic inversion of signal IN1, a buffer of buffer circuit 122 that receives signal OUT1 does not transition between logical voltage levels, and buffer circuit 122 outputs signal Reset having an unchanged level corresponding to one of the high logic level H or the low logic level L.

Similarly, in the second embodiment, because signal OUT2 remains above the low logic level L throughout the duration of the logic inversion of signal IN2, a buffer of buffer circuit 122 that receives signal OUT2 does not transition between logical voltage levels, and buffer circuit 122 outputs signal Reset having an unchanged level corresponding to one of the high logic level H or the low logic level L.

Figure 6:
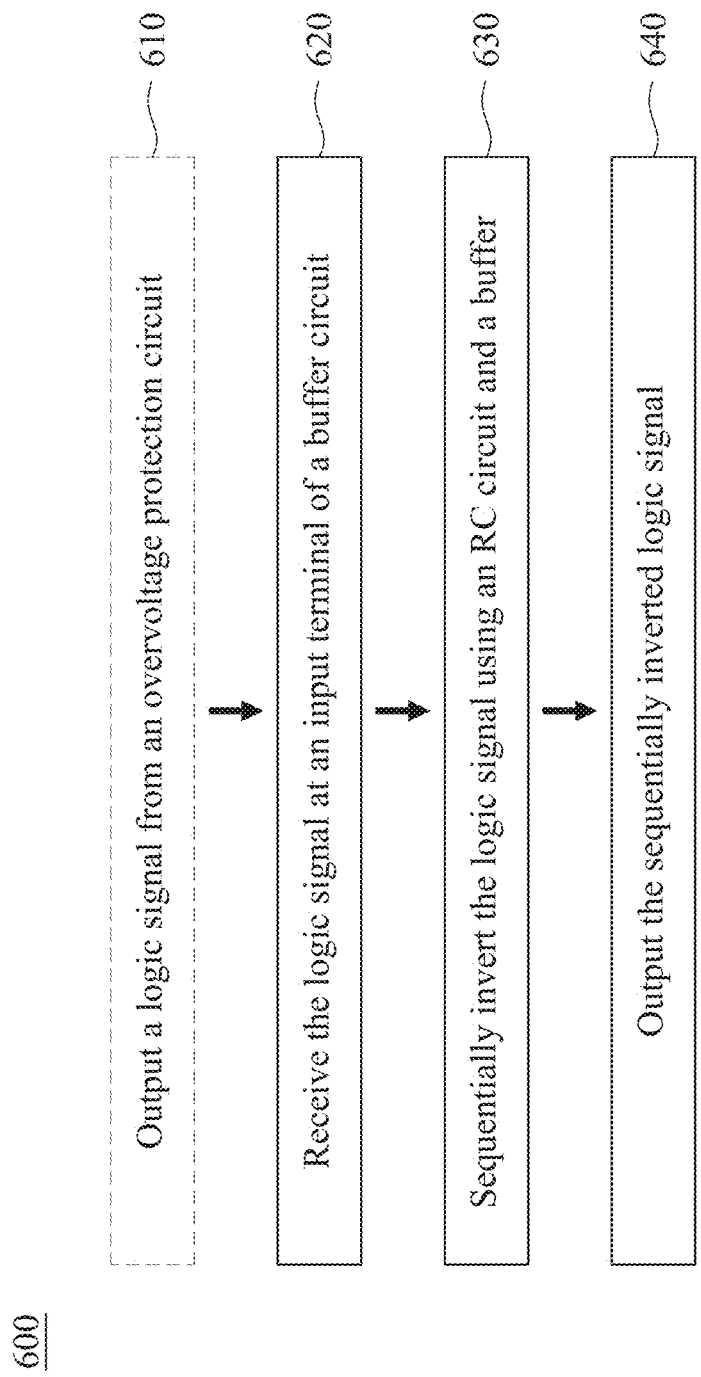
FIG. 6 is a flowchart of a method of operating a buffer circuit, in accordance with some embodiments.

FIG. 6 is a flowchart of a method 600 of operating a buffer circuit, in accordance with some embodiments. Method 600 is usable with a buffer circuit, e.g., buffer circuit 122, 222A, 222B, or 400 discussed above with respect to FIGS. 1-4, and with an IC system including a buffer circuit, e.g., IC system 100 including buffer circuit 122 discussed above with respect to FIG. 1.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6. In some embodiments, some or all of the operations of method 600 are part of operating a SoC, e.g., a SoC included in IC chip 120 discussed above with respect to FIG. 1.

At operation 610, in some embodiments, a logic signal is output from an overvoltage protection circuit. Outputting the logic signal includes outputting the logic signal having either one of a high logical voltage level or a low logical voltage level, and having a first transition time corresponding to one or both of transitioning from the high logical voltage level to the low logical voltage level or transitioning from the low logical voltage level to the high logical voltage level.

In some embodiments, outputting the logic signal from the overvoltage protection circuit includes outputting signal RextPC from protection circuit 110, as discussed above with respect to FIG. 1. In some embodiments, outputting the logic signal includes outputting the logic signal including a logic inversion, as discussed above with respect to FIGS. 1-5.

At operation 620, the logic signal is received at an input terminal of a buffer circuit. Receiving the logic signal includes receiving the logic signal having the first transition time. In some embodiments, receiving the logic signal includes receiving the logic signal including a logic inversion, as discussed above with respect to FIGS. 1-5.

In some embodiments, receiving the logic signal at the input terminal of the buffer circuit includes receiving signal RextPC at input terminal 123 of buffer circuit 122, discussed above with respect to FIGS. 1-2B and 4.

In some embodiments, receiving the logic signal at the input terminal of the buffer circuit includes receiving the logic signal at an input pad of an IC chip, e.g., IC chip 120 including a SoC, discussed above with respect to FIG. 1.

At operation 630, the logic signal is sequentially inverted using an RC circuit and a buffer. Sequentially inverting the logic signal using the RC circuit and the buffer includes inverting the logic signal using the RC circuit followed by inverting the logic signal using the buffer. The RC circuit is coupled to an input terminal of the buffer, and inverting the logic signal using the RC circuit includes using a resistive device of an RC network to couple the input terminal of the buffer to one of a power supply voltage node or a reference voltage node.

Inverting the logic signal using the RC circuit includes increasing a transition time of the logic signal from the first transition time to a second transition time by using the RC network to couple the input terminal of the buffer to one of the power supply voltage node or the reference voltage node.

In some embodiments, using the RC network to couple the input terminal of the buffer to one of the power supply voltage node or the reference voltage node includes using a transistor to decouple the input terminal of the buffer from the other of the power supply voltage node or the reference voltage node.

In some embodiments, inverting the logic signal using the RC circuit includes inverting signal IN to generate signal OUT using one of delay circuits 300A-300D discussed above with respect to FIGS. 3A-3D.

In some embodiments, using the RC network to couple the input terminal of the buffer to one of the power supply voltage node or the reference voltage node includes using the RC network to couple the input terminal of the buffer including a hysteresis circuit. In some embodiments, using the RC network to couple the input terminal of the buffer to one of the power supply voltage node or the reference voltage node includes using the RC network to couple the input terminal of an inverter INV1-INVN, discussed above with respect to FIGS. 2A and 2B.

In various embodiments, inverting the logic signal using the RC circuit includes inverting the logic signal received at the input terminal of the buffer circuit or inverting the logic signal after being inverted by a buffer between the input terminal of the buffer circuit and the RC circuit.

In some embodiments, inverting the logic signal using the buffer includes sequentially inverting the logic signal using a plurality of buffers. In some embodiments, inverting the logic signal using the buffer includes inverting the logic signal using one or more of inverters INV1-INVN, discussed above with respect to FIGS. 2A and 2B.

At operation 640, the sequentially inverted logic signal is output from an output terminal of the buffer circuit. Outputting the sequentially inverted logic signal from the buffer circuit includes outputting the inverted logic signal having the second transition time. In various embodiments, outputting the sequentially inverted logic signal from the buffer circuit includes outputting the inverted logic signal synchronized to the received logic signal or complementary to the received logic signal.

In some embodiments, outputting the sequentially inverted logic signal includes outputting signal Rint, discussed above with respect to FIGS. 1-5. In some embodiments, outputting the sequentially inverted logic signal includes outputting signal RDint, discussed above with respect to FIGS. 2A, 2B, and 4.

In some embodiments, outputting the sequentially inverted logic signal includes outputting a reset signal of an IC chip, e.g., IC chip 120 including a SoC, discussed above with respect to FIG. 1.

By executing some or all of the operations of method 600, a buffer circuit outputs a logic signal having an increased transition time between logical voltage levels relative to a transition time between logical voltage levels of a received logic signal, thereby obtaining the benefits discussed above with respect to IC system 100 and buffer circuits 122, 222A, and 222B.

In some embodiments, a buffer circuit includes an input terminal configured to receive an input signal, an output terminal, a buffer, and an RC circuit coupled in series with the buffer between the input terminal and the output terminal. The RC circuit includes a first transistor and an RC network including a resistor and a capacitor, the first transistor is coupled in series with the resistor between a power supply node and a reference node, and the buffer and the RC circuit are configured to generate an output signal based on the input signal. In some embodiments, the RC network includes the capacitor arranged in parallel with the resistor. In some embodiments, the RC network comprises the capacitor coupled in series with the resistor between the power supply node and the reference node. In some embodiments, the RC circuit includes an RC circuit output terminal coupled to the first transistor and an input terminal of the buffer and a second transistor coupled between the output terminal of the RC circuit and the resistor, the first transistor is a first one of an NMOS or PMOS transistor, the second transistor is a second one of the NMOS or PMOS transistor, and each of a gate of the first transistor and a gate of the second transistor is coupled to an input terminal of the RC circuit. In some embodiments, each of the buffer and the RC circuit includes an inverter, and the buffer and the RC circuit are configured to generate the output signal having a same low or high logical voltage level as that of the input signal in a steady state. In some embodiments, the buffer and the RC circuit are configured to generate the output signal having an increased transition time between logical voltage levels relative to a transition time between logical voltage levels of the input signal by a time ranging from 0.2 µs to 1000 µs. In some embodiments, the buffer is a first inverter of a plurality of inverters coupled between the input and output terminals, the first inverter of the plurality of inverters is coupled between the RC circuit and the output terminal, and a second inverter of the plurality of inverters is coupled to the input terminal and includes a hysteresis circuit. In some embodiments, the buffer circuit includes a first logic circuit arranged in parallel with the series arrangement of the buffer and RC circuit and a second logic circuit coupled between the first logic circuit and the output terminal, and the buffer circuit is configured to generate the output signal further based on the first and second logic circuits.

In some embodiments, a system includes an overvoltage protection circuit configured to generate a protected signal at an overvoltage protection circuit output terminal and a buffer circuit configured to generate a buffer circuit output signal at a buffer circuit output terminal, the buffer circuit including an input terminal coupled to the overvoltage protection circuit output terminal, a buffer, and an RC circuit coupled in series with the buffer between the input terminal and the buffer circuit output terminal. The buffer circuit and the RC circuit are configured to generate the buffer circuit output signal based on the protected signal, the RC circuit includes a first transistor and an RC network comprising a resistor and a capacitor, and the first transistor is coupled in series with the resistor between a power supply node and a reference node. In some embodiments, the RC network includes the capacitor arranged in parallel with the resistor. In some embodiments, the RC network includes the capacitor coupled in series with the resistor between the power supply node and the reference node. In some embodiments, the system includes a power-on circuit configured to receive the buffer circuit output signal. In some embodiments, the buffer circuit includes a first logic circuit configured to generate the buffer circuit output signal based on the protected signal received at the RC circuit and at a second logic circuit. In some embodiments, the overvoltage protection circuit is configured to generate the protected signal having a voltage level at or near a reference voltage level for a duration ranging from 0.1 µs to 100 µs.

In some embodiments, a method of operating a buffer circuit incudes receiving a logic signal at an input terminal of the buffer circuit, sequentially inverting the logic signal using each of an RC circuit and a buffer, the RC circuit being coupled to an input terminal of the buffer and including a transistor and an RC network including a resistor and a capacitor, and outputting the sequentially inverted logic signal at an output terminal of the buffer circuit. Inverting the logic signal using the RC circuit includes using the resistor to couple the input terminal of the buffer to one of a power supply voltage node or a reference voltage node and using the transistor to decouple the input terminal of the buffer from the other of the power supply voltage node or the reference voltage node. In some embodiments, the method includes outputting the logic signal from an overvoltage protection circuit. In some embodiments, receiving the logic signal at the input terminal of the buffer circuit includes receiving the logic signal at an input pad of an IC chip. In some embodiments, outputting the sequentially inverted logic signal at the output terminal of the buffer circuit includes outputting a reset signal of a power-on circuit of an IC chip. In some embodiments, inverting the logic signal using the RC network includes coupling and decoupling the input terminal of the buffer including a hysteresis circuit. In some embodiments, using the transistor to decouple the input terminal of the buffer from the other of the power supply voltage node or the reference voltage node includes using an NMOS transistor to decouple the input terminal of the buffer from the reference voltage node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A buffer circuit comprising:
an input terminal configured to receive an input signal;
an output terminal;
a buffer; and
a resistor-capacitor (RC) circuit coupled in series with the buffer between the input terminal and the output terminal,
wherein
the RC circuit comprises a first transistor and an RC network comprising a resistor and a capacitor,
the first transistor is coupled in series with the resistor between a power supply node and a reference node, and
the buffer and the RC circuit are configured to generate an output signal based on the input signal.

2. The buffer circuit of claim 1, wherein the RC network comprises the capacitor arranged in parallel with the resistor.

3. The buffer circuit of claim 1, wherein the RC network comprises the capacitor coupled in series with the resistor between the power supply node and the reference node.

4. The buffer circuit of claim 1, wherein the RC circuit comprises:
an RC circuit output terminal coupled to the first transistor and an input terminal of the buffer; and
a second transistor coupled between the output terminal of the RC circuit and the resistor, wherein
the first transistor is a first one of an NMOS or PMOS transistor,
the second transistor is a second one of the NMOS or PMOS transistor, and
each of a gate of the first transistor and a gate of the second transistor is coupled to an input terminal of the RC circuit.

5. The buffer circuit of claim 1, wherein
each of the buffer and the RC circuit comprises an inverter, and
the buffer and the RC circuit are configured to generate the output signal having a same low or high logical voltage level as that of the input signal in a steady state.

6. The buffer circuit of claim 1, wherein the buffer and the RC circuit are configured to generate the output signal having an increased transition time between logical voltage levels relative to a transition time between logical voltage levels of the input signal by a time ranging from 0.2 microseconds (µs) to 1000 µs.

7. The buffer circuit of claim 1, wherein
the buffer is a first inverter of a plurality of inverters coupled between the input and output terminals,
the first inverter of the plurality of inverters is coupled between the RC circuit and the output terminal, and
a second inverter of the plurality of inverters is coupled to the input terminal and comprises a hysteresis circuit.

8. The buffer circuit of claim 1, further comprising:
a first logic circuit arranged in parallel with the series arrangement of the buffer and RC circuit; and
a second logic circuit coupled between the first logic circuit and the output terminal,
wherein the buffer circuit is configured to generate the output signal further based on the first and second logic circuits.

9. A system comprising:
an overvoltage protection circuit configured to generate a protected signal at an overvoltage protection circuit output terminal; and
a buffer circuit configured to generate a buffer circuit output signal at a buffer circuit output terminal, the buffer circuit comprising:
an input terminal coupled to the overvoltage protection circuit output terminal;
a buffer; and
a resistor-capacitor (RC) circuit coupled in series with the buffer between the input terminal and the buffer circuit output terminal,
wherein
the buffer circuit and the RC circuit are configured to generate the buffer circuit output signal based on the protected signal,
the RC circuit comprises a first transistor and an RC network comprising a resistor and a capacitor, and
the first transistor is coupled in series with the resistor between a power supply node and a reference node.

10. The system of claim 9, wherein the RC network comprises the capacitor arranged in parallel with the resistor.

11. The system of claim 9, wherein the RC network comprises the capacitor coupled in series with the resistor between the power supply node and the reference node.

12. The system of claim 9, further comprising a power-on circuit configured to receive the buffer circuit output signal.

13. The system of claim 9, wherein the buffer circuit comprises a first logic circuit configured to generate the buffer circuit output signal based on the protected signal received at the RC circuit and at a second logic circuit.

14. The system of claim 9, wherein the overvoltage protection circuit is configured to generate the protected signal having a voltage level at or near a reference voltage level for a duration ranging from 0.1 microseconds (µs) to 100 µs.

15. A method of operating a buffer circuit, the method comprising:
receiving a logic signal at an input terminal of the buffer circuit;
sequentially inverting the logic signal using each of a resistor-capacitor (RC) circuit and a buffer, the RC circuit being coupled to an input terminal of the buffer and comprising a transistor and an RC network comprising a resistor and a capacitor; and
outputting the sequentially inverted logic signal at an output terminal of the buffer circuit,
wherein the inverting the logic signal using the RC circuit comprises:
using the resistor to couple the input terminal of the buffer to one of a power supply voltage node or a reference voltage node; and
using the transistor to decouple the input terminal of the buffer from the other of the power supply voltage node or the reference voltage node.

16. The method of claim 15, further comprising outputting the logic signal from an overvoltage protection circuit.

17. The method of claim 15, wherein the receiving the logic signal at the input terminal of the buffer circuit comprises receiving the logic signal at an input pad of an integrated circuit (IC) chip.

18. The method of claim 15, wherein the outputting the sequentially inverted logic signal at the output terminal of the buffer circuit comprises outputting a reset signal of a power-on circuit of an integrated circuit (IC) chip.

19. The method of claim 15, wherein the inverting the logic signal using the RC network comprises coupling and decoupling the input terminal of the buffer including a hysteresis circuit.

20. The method of claim 15, wherein the using the transistor to decouple the input terminal of the buffer from the other of the power supply voltage node or the reference voltage node comprises using an NMOS transistor to decouple the input terminal of the buffer from the reference voltage node.

* * * * *